United States Patent
Liu

(10) Patent No.: US 6,865,083 B2
(45) Date of Patent: Mar. 8, 2005

(54) CLIP FOR HEAT SINK

(75) Inventor: HouBen Liu, Shehzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 240 days.

(21) Appl. No.: 10/137,621

(22) Filed: May 1, 2002

(65) Prior Publication Data
US 2003/0178226 A1 Sep. 25, 2003

(30) Foreign Application Priority Data
Mar. 20, 2002 (TW) .......................................... 91203386

(51) Int. Cl.[7] .............................................. H05K 7/20
(52) U.S. Cl. ...................... 361/704; 257/706; 257/718; 165/80.2; 165/80.3; 361/709; 361/712
(58) Field of Search ................... 174/252; 361/709–711, 361/704–708; 257/706, 718, 719, 727; 165/80.2, 80.3

(56) References Cited

U.S. PATENT DOCUMENTS

| | | | | |
|---|---|---|---|---|
| 6,061,240 A | * | 5/2000 | Butterbaugh et al. | ....... 361/704 |
| 6,104,614 A | * | 8/2000 | Chou et al. | ................. 361/704 |
| 6,112,378 A | * | 9/2000 | Lee | .............................. 24/458 |
| 6,219,244 B1 | * | 4/2001 | Chen | ........................... 361/704 |
| 6,301,113 B1 | * | 10/2001 | Guerrero | ..................... 361/704 |
| 6,304,452 B1 | * | 10/2001 | Lo | .............................. 361/704 |
| 6,373,703 B2 | * | 4/2002 | Johnson et al. | ............. 361/704 |
| 6,496,372 B1 | * | 12/2002 | Davison et al. | ............. 361/704 |
| 6,666,640 B1 | * | 12/2003 | Hsieh | ......................... 411/508 |

* cited by examiner

Primary Examiner—Kamand Cuneo
Assistant Examiner—Jeremy Norris
(74) Attorney, Agent, or Firm—Wei Te Chung

(57) ABSTRACT

A clip (30) for securing a heat sink (40) to an electronic device (52) includes a pin (32) and a pressing member (34), each of which are integrally formed by stamping sheet metal. The pin includes a cylindrical body having a vertical notch (321), a pair of symmetrically opposite latches (323) depending from the cylindrical body to enable the pin to elastically deform, and a pair of barbs (325) extending outwardly and slightly upwardly from bottom ends of the latches respectively. The pressing member includes a circular body (341), a column (347) depending from the circular body, and a pair of spring arms (343) extending outwardly and downwardly from opposite sides of the circular body. A distal end of each spring arm is bent inwardly and upwardly to form an elbow portion (345). An opening (349) is defined through the circular body and the column, for receiving the pin.

12 Claims, 4 Drawing Sheets

CLIP FOR HEAT SINK

BACKGROUND OF THE INVENTION

1. Field of the Invention

The present invention relates to heat sink clips, and particularly to a clip which readily and securely attaches a heat sink to an electronic device mounted on a circuit board.

2. Prior Art

Computer electronic devices such as central processing units (CPUs) frequently generate large amounts of heat. Many modern high frequency and high speed CPUs become particularly hot during operation, which can destabilize operation and cause damage. A heat sink placed in thermal contact with an electronic device mounted on a socket transfers heat from the electronic device through conduction. Oftentimes, the heat sink is secured to the electronic device by a clip.

Referring to FIG. 6, a conventional clip assembly comprises a pin 1 and a plug 2. The pin 1 includes a columnar body 3 having a screw thread, and a bifurcated barb 6 formed at a bottom end of the body 3. An aperture 4 is defined through an upper portion of the body 3, and a vertical slot 5 is defined through a lower portion of the body 3 in communication with the aperture 4. The plug 2 includes a shaft 7 corresponding to the aperture 4 of the pin 1, an expanded head 8 formed at a top end of the shaft 7, and a cone-shape insertion end 9 formed at a bottom end of the shaft 7. The insertion end 9 has a diameter substantially greater than that of the shaft 7.

In assembly, the pin 1 is successively extended through a corresponding aperture 12 of a heat sink 10 and a corresponding fixing hole 22 of a circuit board 20. The plug 2 is then plugged into the pin 1, with the insertion end 9 of the plug 2 pushing along through the vertical slot 5 of the pin 1. The insertion end 9 of the plug 2 then clasps the barb 6 of the pin 1, thereby fixing the heat sink 10 to both the circuit board 20 and an electronic device 24 mounted on the circuit board 20.

The conventional clip assembly is generally made of insulative material and not attached to a grounding circuit of the circuit board 20. Therefore, the clip assembly does not provide electromagnetic interference (EMI) shielding for the electronic device 24. This can compromise the soundness and stability of the electronic device 24. On the other hand, U.S. Pat. No. 6,112,378 discloses some approach. Anyhow, an easy and economic design is still desired.

SUMMARY OF THE INVENTION

Accordingly, an object of the present invention is to provide a clip which readily and securely attaches a heat sink to an electronic device.

Another object of the present invention is to provide a clip which provides EMI shielding for an electronic device.

To achieve the above-mentioned object, a clip in accordance with the present invention comprises a pin and a pressing member, each of which are integrally formed by stamping sheet metal. The pin includes a cylindrical body having a vertical notch defined therein, a pair of symmetrically opposite latches depending from the cylindrical body to enable the pin to elastically deform, and a pair of barbs extending outwardly and slightly upwardly from bottom ends of the latches respectively. The pressing member includes a circular body, a column depending from a middle of the circular body, and a pair of spring arms extending outwardly and downwardly from opposite sides of the circular body. A distal end of each spring arm is bent inwardly and upwardly to form an elbow portion. An opening is defined through the circular body and the column, for receiving the pin.

Other objects, advantages and novel features of the present invention will be drawn from the following detailed embodiment of the present invention with attached drawings, in which:

DESCRIPTION OF THE PREFERRED EMBODIMENT

Figure 1:
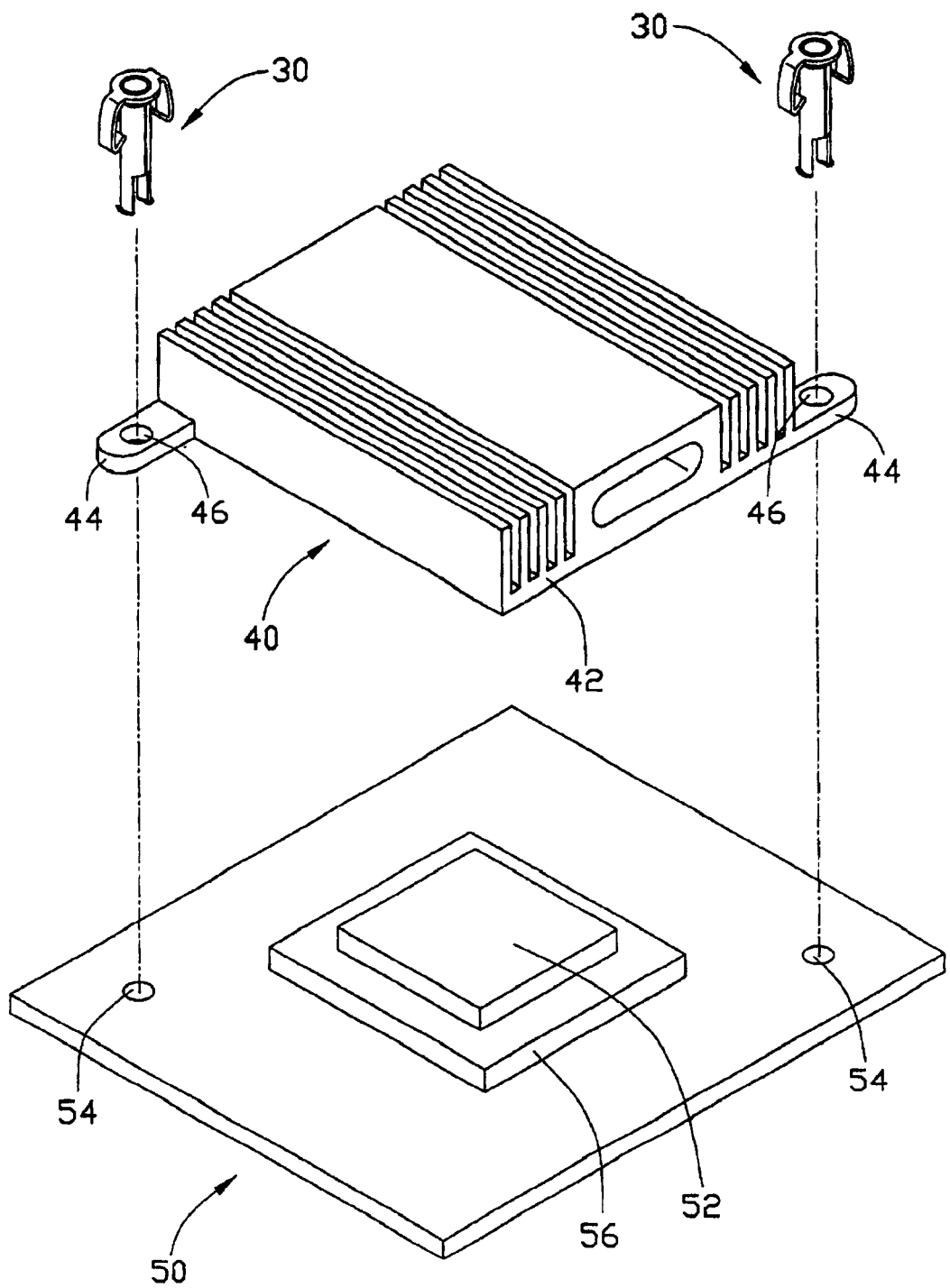
FIG. 1 is an exploded perspective view of a pair of clips each of the present invention, together with a heat sink and an electronic device mounted on a socket on a printed circuit board.

Referring to FIG. 1, a pair of clips 30 each in accordance with the present invention can be used for attaching a heat sink 40 to an electronic device 52 mounted on a socket 56 on a printed circuit board (PCB) 50. The heat sink 40 comprises a chassis 42, and a pair of fastening ears 44 respectively extending outwardly in opposite directions from diagonally opposite corners of the chassis 42. Each fastening ear 44 defines a fastening hole 46 therein. A pair of fixing holes 54 is defined in the PCB 50 at diagonally opposite sides of the electronic device 52. The clips 30 are extended through the fastening holes 46 and the fixing holes 54.

Figure 2:
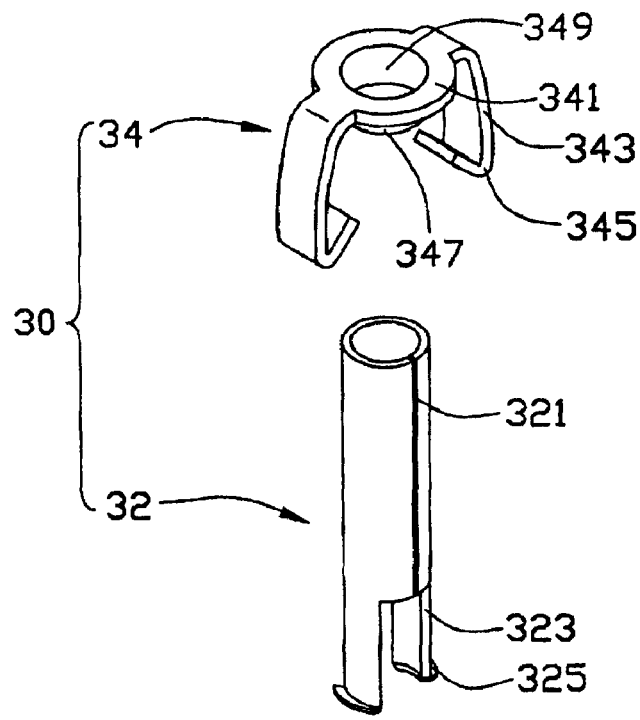
FIG. 2 is an enlarged exploded view of one of the clips of FIG. 1.
Figure 3:
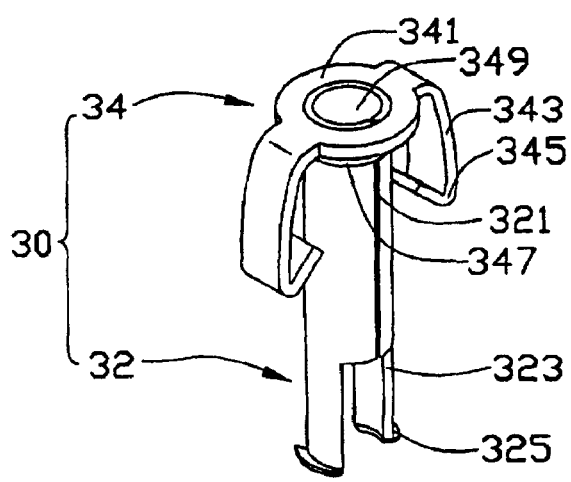
FIG. 3 is an assembled view of FIG. 2.

Referring to FIGS. 2 and 3, each clip 30 comprises a pin 32 and a pressing member 34, each of which are integrally formed by stamping sheet metal. The pin 32 includes a cylindrical body having a vertical notch/seam 321 defined therein, a pair of symmetrically opposite latches 323 depending from the cylindrical body to enable the pin 32 to elastically deform, and a pair of stops 325 extending outwardly and slightly upwardly from bottom ends of the latches 323 respectively. In the preferred embodiment, each stop 325 is a barb 325. The pressing member 34 includes a circular body 341, a column 347 depending from a middle of the circular body 341, and a pair of spring arms 343 extending outwardly and downwardly from opposite sides of the circular body 341 respectively. A distal end of each spring arm 343 is bent inwardly and upwardly to form an elbow portion 345. An opening 349 is defined through the circular body 341 and the column 347, for receiving the pin 32.

Figure 4:
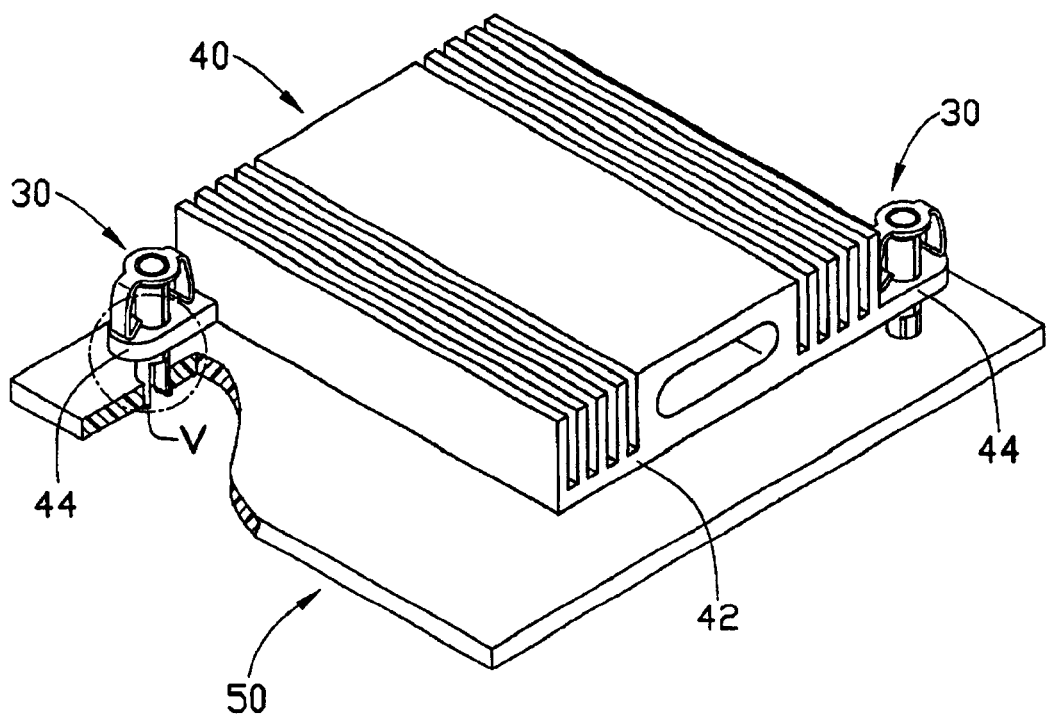
FIG. 4 is an assembled view of FIG. 1, with a portion of the PCB cut away for better illustration.
Figure 5:
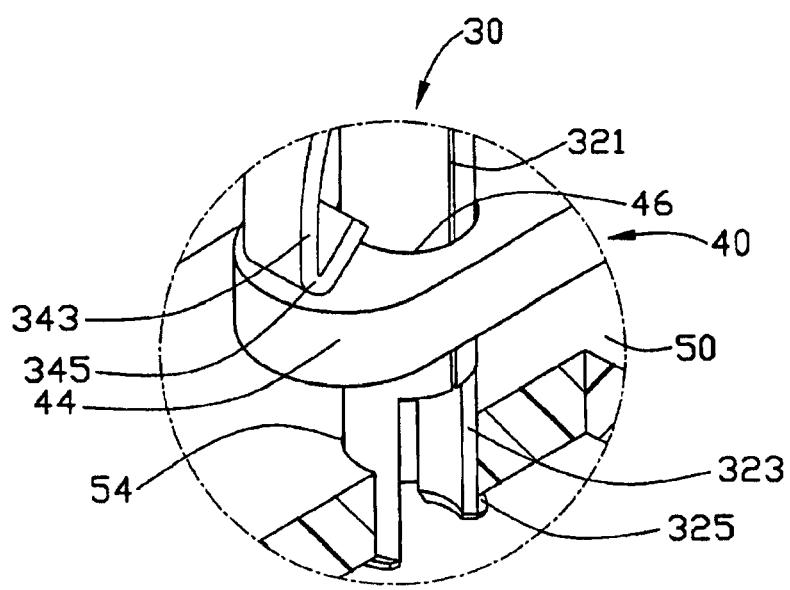
FIG. 5 is an enlarged view of a circled portion V of FIG. 4.
Figure 6:
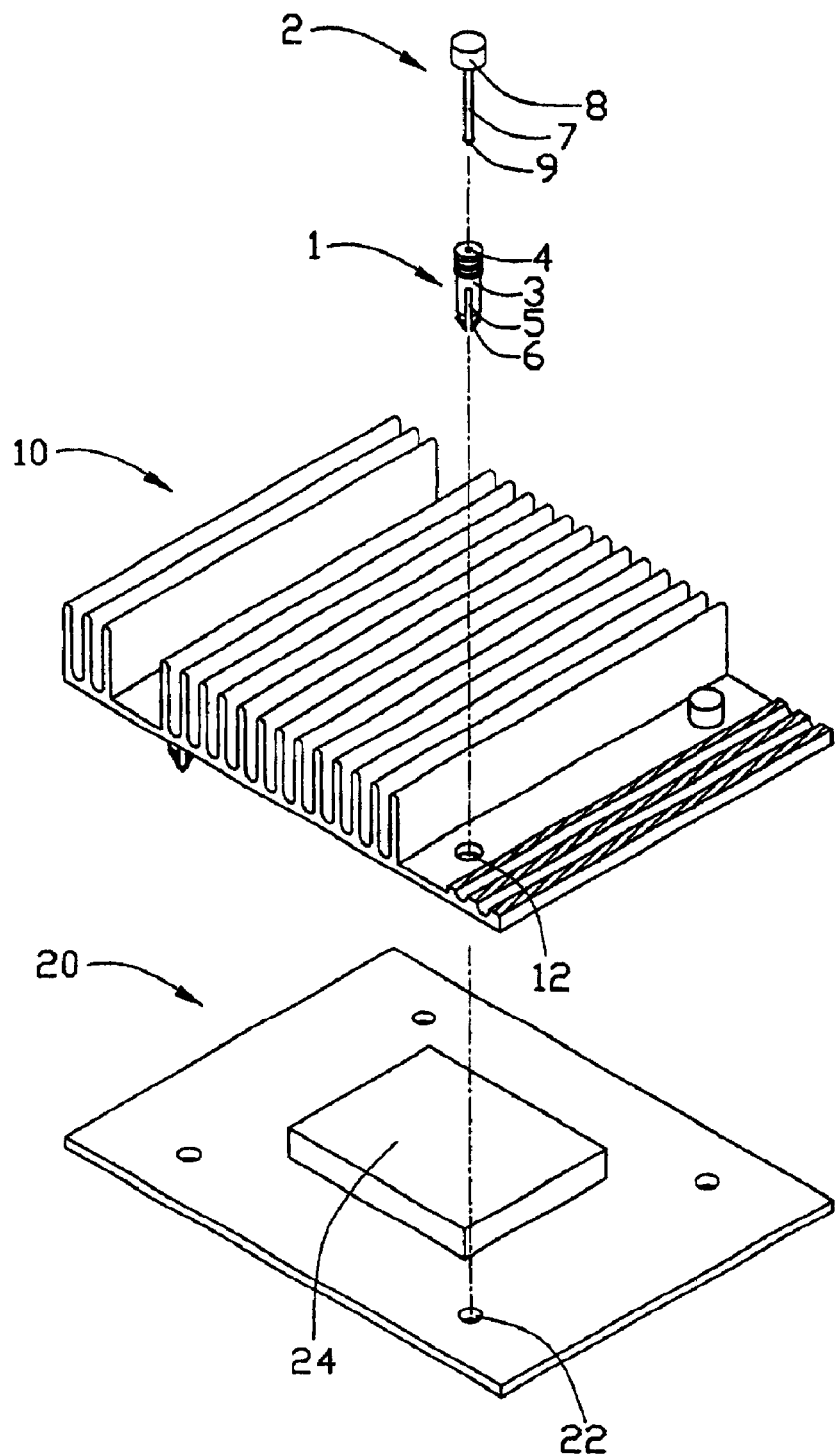
FIG. 6 is an exploded perspective view of a conventional clip, together with a heat sink and an electronic device mounted on a printed circuit board.

Referring also to FIGS. 4 and 5, in assembly, each pin 32 is fixed to the corresponding pressing member 34 with a rivet to form one clip 30. Each clip 30 is pressed through the corresponding fastening hole 46 of the heat sink 40 and corresponding fixing hole 54 of the PCB 50. The barbs 325 of the clips 30 interferentially engage a bottom surface of the PCB 50 at the fixing holes 54, to prevent the clips 30 from separating from the PCB 50. The spring arms 343 of the clips 30 are elastically deformed, thereby causing the elbow portions 345 thereof to resiliently press the fastening ears 44 of the heat sink 40. The heat sink 40 is thus resiliently and firmly attached to the electronic device 52 and the PCB 50.

The clip 30 of the present invention is formed by stamping sheet metal. Each clip 30 may be attached to a grounding circuit of the PCB 50. Accordingly, the clips 30 are able to provide EMI shielding for the electronic device 52.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted to secure a heat sink to an electronic device mounted on a circuit board, the clip comprising:
    a pin comprising at least two elastically deformable latches at an end thereof, each of the latches comprising a stop at an end thereof; and
    a pressing member comprising a body defining a through opening with insertion of an opposite end of the pin, and at least two spring anus arranged around the body, wherein the pressing member further comprises a column at a bottom of the body, the column circling said opposite end of the pin.

2. A heat sink assembly comprising:
    a heat sink defining a pair of apertures;
    a circuit board defining a pair of holes in alignment with the apertures of the heat sink; and
    a pair of clips, each of the clips comprising a tubular pin and a pressing member, the pin extending through a corresponding aperture and a corresponding hole and comprising a pair of latches engaging with the circuit board, the pressing member elastically pressing the heat sink toward the circuit board.

3. The heat sink assembly as described in claim 2, wherein the pin and the pressing member are each integrally stamped from sheet metal.

4. The heat sink assembly as described in claim 2, wherein the pin defines a notch along an axial direction thereof for allowing elastic deformation thereof.

5. The heat sink assembly as described in claim 2, wherein the latches are symmetrically opposite to each other at an end of the pin, and each of the latches comprises a stop at an end thereof.

6. The heat sink assembly as described in claim 2, wherein the pressing member comprises a body and a pair of spring arms extending downwardly away from opposite sides of the body.

7. The heat sink assembly as described in claim 6, wherein each of the spring arms comprises an elbow-shaped portion at a bottom thereof exerting on the heat sink.

8. The heat sink assembly as described in claim 6, wherein the pressing member further comprises a column at a bottom of the body engaging with the pin.

9. The heat sink assembly as described in claim 2, wherein the heat sink comprises a chassis.

10. The heat sink assembly as described in claim 9, wherein the chassis comprises a pair of ears at diagonally opposite portions thereof, and the apertures are defined in the ears.

11. An assembly comprising:
    a first plate defining a first through hole;
    a second plate positioned under said first plate and defining a second through hole in alignment with said first through hole;
    a clip fastening said first plate and second plate together, said clip including a pin and a pressing member,
    said pin stamped end formed from a sheet of conductive material, said pin including a vertical body with a scam vertically extending therethrough, a pair of spatial latches extending downwardly from the body with a pair of stops outwardly projecting away from each other, respectively; and
    said pressing member including a horizontal body defining an opening grasping a top portion of the pin to prevent said pin from splitting at said seam, and a pair of spring arms downwardly extending from said horizontal body; wherein
    the pin extends through both said first and second holes under a condition that the spring arms abut against a top surface of the first plate and the stops abut against an undersurface of the second plate.

12. A clip adapted to secure a heat sink to an electronic device mounted on a circuit board, the clip comprising:
    a pin comprising at least two elastically deformable latches at an end thereof, each of the latches comprising a stop at an end thereof; and
    a pressing member comprising a body defining a through opening with insertion of an opposite end of the pin, and at least two spring arms arranged around the body, wherein the pin is substantially tube-shaped.

* * * * *